(12) United States Patent
Sahara et al.

(10) Patent No.: US 7,093,215 B2
(45) Date of Patent: Aug. 15, 2006

(54) SEMICONDUCTOR CIRCUIT DEVICE AND CIRCUIT SIMULATION METHOD FOR THE SAME

(75) Inventors: Yasuyuki Sahara, Kyoto (JP); Katsuhiro Ootani, Nara (JP); Kazuhisa Nakata, Osaka (JP); Shinsaku Sekido, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 309 days.

(21) Appl. No.: 10/751,892

(22) Filed: Jan. 7, 2004

(65) Prior Publication Data

US 2004/0153986 A1    Aug. 5, 2004

(30) Foreign Application Priority Data

Feb. 5, 2003    (JP) .............................. 2003-027890

(51) Int. Cl.
*G06F 17/50*    (2006.01)
(52) U.S. Cl. ...................... 716/4; 716/1; 716/8; 703/13
(58) Field of Classification Search ...................... None
See application file for complete search history.

(56) References Cited

U.S. PATENT DOCUMENTS

| | | | |
|---|---|---|---|
| 5,281,835 A * | 1/1994 | Tomita et al. ............... 257/204 |
| 5,514,895 A * | 5/1996 | Kikushima et al. .......... 257/378 |
| 6,295,630 B1 * | 9/2001 | Tamegaya ....................... 716/4 |
| 6,898,778 B1 * | 5/2005 | Kawanaka ..................... 716/18 |
| 6,912,697 B1 * | 6/2005 | Shibata et al. .................. 716/1 |
| 2002/0020878 A1 | 2/2002 | Kawanaka |
| 2002/0035462 A1 * | 3/2002 | Kidera et al. ................. 703/14 |

FOREIGN PATENT DOCUMENTS

CN    200410005325.5    *    3/2006

\* cited by examiner

*Primary Examiner*—Leigh M. Garbowski
(74) *Attorney, Agent, or Firm*—McDermott Will & Emery LLP

(57) ABSTRACT

An inventive semiconductor circuit device includes an N-well and a P-well. The N-well is provided with PMIS active areas surrounded by a trench isolation, and the P-well is provided with NMIS active areas surrounded by the trench isolation. The PMIS active areas are each provided with a gate of a P-channel transistor, and the NMIS active areas are each provided with a gate of an N-channel transistor. A layout is designed such that a distance Dpn between the NMIS active areas and the PMIS active areas in a Y-direction substantially becomes a fixed value. Thus, trench isolation stresses applied from the trench isolations to channel regions under the gates become uniform for respective transistors, resulting in an improvement in accuracy of circuit simulation.

14 Claims, 10 Drawing Sheets

US 7,093,215 B2

SEMICONDUCTOR CIRCUIT DEVICE AND CIRCUIT SIMULATION METHOD FOR THE SAME

BACKGROUND OF THE INVENTION

The present invention relates to semiconductor circuit devices implemented by integration of a large number of MIS transistors, and in particular relates to measures to reduce variations in transistor characteristics.

In recent years, an LSI (Large Scale Integration), as typified by a microprocessor, has generally been implemented by combining a large number of units each of which has a basic function and is called a cell. In each cell, numerous elements such as MIS transistors, capacitors and resistors are provided. As the performance and packing density of an LSI are increased, the circuit design for cells that determine the performance of an LSI is becoming very important. Furthermore, in carrying out the circuit design for cells with high precision, a CAD (Computer Aided Design) tool plays an extremely important role.

As a CAD tool deeply concerned in design accuracy, a circuit simulator is known. A circuit simulator is used to carry out circuit simulation for cells and an LSI that have been designed. To be more specific, using a circuit simulator, conceivable circuit operations of the cells and LSI that are to be presumably fabricated according to the design are simulated based on a netlist including pieces of information concerning connections between associated elements such as transistors, capacitors and resistors, and pieces of information concerning characteristics of the elements such as transistor sizes, capacitance values and resistance values. For example, such a netlist can be extracted from mask layouts of designed cells by using a circuit extractor. As for pieces of information concerning transistor characteristics, in order to precisely reproduce complicated electrical characteristics of transistors in a circuit simulator, numerous expressions representing electrical characteristics (hereinafter, called "transistor model") are now being developed. Besides, in order to reproduce a desired transistor characteristic using a transistor model, model parameters included in the transistor model must be optimized in accordance with the desired transistor characteristic (hereinafter, simply called "model parameter extraction").

Described below are a layout of a cell provided in a conventional semiconductor circuit device and a transistor model used in designing a conventional cell.

First, the cell layout will be described by using a cell layout shown in FIG. 8 as an example.

FIG. 8 is a plan view schematically illustrating an exemplary layout of a conventional cell 100 provided in a part of a semiconductor substrate. The semiconductor substrate is provided with an N-well 102 and a P-well 103 that are adjacent to each other with a well boundary 110 located therebetween. The N-well 102 is provided with first through third PMIS active areas Rtp1 through Rtp3 surrounded by a trench isolation Ris. On the other hand, the P-well 103 is provided with first through third NMIS active areas Rtn1 through Rtn3 surrounded by the trench isolation Ris. Herein, the "PMIS active area" refers to an active area for a P-channel MIS transistor, while the "NMIS active area" refers to an active area for an N-channel MIS transistor. Although three active areas are exemplarily provided in each of the N-well 102 and the P-well 103 in FIG. 8, a considerably large number of active areas are provided in an actual semiconductor circuit device. The first, second and third PMIS active areas Rtp1, Rtp2 and Rtp3 are provided with gates 107 of P-channel transistors. On the other hand, the first, second and third NMIS active areas Rtn1, Rtn2 and RTn3 are provided with gates 109 of N-channel transistors. It should be noted that, like a known transistor, each gate has a so-called "insulated gate structure" formed by a gate insulating film and a gate electrode, although not shown.

The semiconductor substrate is further provided with: an N-type substrate active area 104 through which a power supply voltage is supplied to respective elements in the cell 100; and a P-type substrate active area 105 through which a reference electric potential is supplied to respective elements in the cell 100.

Parts of each active area, located on the sides of each gate, are defined as source/drain regions. Upon application of voltage between the source/drain regions and application of bias to each gate, a channel is formed in a part of each active area, located under each gate, and an electric current flows through the channel.

Since various cells are generally combined in an LSI, a distance between a width YN+ of the N-type substrate active area 104 extending in a Y-direction and a width YP+ of the P-type substrate active area 105 extending in the Y-direction, i.e., a distance Dsell between the N-type substrate active area 104 and the P-type substrate active area 105, is standardized at a common value for each group of cells. Furthermore, a layout rule for the process of forming the cell 100 specifies: a lower limit S1 of a distance between the N-type substrate active area 104 and the first through third PMIS active areas Rtp1 through Rtp3; a lower limit S2 of a distance between the first through third PMIS active areas Rtp1 through Rtp3 and the well boundary 110; a lower limit S3 of a distance between the well boundary 110 and the first through third NMIS active areas Rtn1 through Rtn3; and a lower limit S4 of a distance between the first through third NMIS active areas Rtn1 through Rtn3 and the P-type substrate active area 105. Accordingly, in the Y-direction, the first through third PMIS active areas Rtp1 through Rtp3 can be laid out within a range SP located at a distance of the lower limit S1 or more from the N-type substrate active area 104 and at a distance of the lower limit S2 or more from the well boundary 110. Similarly, in the Y-direction, the first through third NMIS active areas Rtn1 through Rtn3 can be laid out within a range SN located at a distance of the lower limit S3 or more from the well boundary 110 and at a distance of the lower limit S4 or more from the P-type substrate active area 105.

FIG. 9 is a diagram schematically illustrating the structure of a transistor for the description of a conventional transistor model. As shown in FIG. 9, the transistor model includes: an active area Rt surrounded by a trench isolation Ris; a gate electrode 112 straddling the active area Rt to reach the trench isolation Ris at both sides of the active area Rt; source/drain regions 114a and 114b located on the sides of the gate electrode 112 of the active area Rt; and a channel region 113 located under the gate electrode 112 of the active area Rt. As indicated by the hatching in FIG. 9, in the transistor model, the channel region 113 of the transistor is defined by a region at which the active area Rt and the gate electrode 112 are overlapped. In addition, in the transistor model, the current drive capability of the transistor is determined by a width W (channel width) and a length L (channel length) of the channel region 113, an electric resistance of the active area Rt, and a load (not shown) added to the active area Rt, and information concerning the layout around the transistor is not taken into consideration.

The conventional semiconductor circuit device has been designed as described above because the design has been carried out on the assumption that the performance of the semiconductor circuit device is determined by the gate length and gate width of each transistor.

However, from the experiments carried out by the present inventors, it is found that the performance of a semiconductor circuit device provided with the latest miniaturized transistors might vary depending on not only the gate length and gate width of each transistor but also the layout of each active area. That is, even if circuit configurations are alike, the current drive capability of each transistor, for example, might vary depending on the layout, and therefore, the performance of an overall semiconductor circuit device is also affected by the layout. Accordingly, depending on a method for extracting model parameters of a transistor model used in designing the conventional cell 100, the performance of a semiconductor circuit device formed based on the design often falls short of the design goal, and it is difficult to maintain the design accuracy of the semiconductor circuit device at a high level.

A compressive stress applied from a trench isolation to a channel region (which will be hereinafter called a "trench isolation stress") affects transistor characteristics in such a manner that a difference occurs between the performances of transistors having identical gate lengths and gate widths. How a trench isolation stress affects transistor characteristics will be described below. In a channel region of each transistor, a lattice strain occurs due to a trench isolation stress. Therefore, in an N-channel transistor, an effective mobility in a channel portion is decreased, and the performance of the N-type transistor tends to be reduced. In a P-type transistor, an effective mobility is also decreased in a channel portion due to a trench isolation stress applied in a gate width direction.

Suppose that one transistor is provided in one active area and the other transistor is provided in the other active area located adjacent to the one active area. In that case, if a distance between the one transistor and the other active area is varied, in particular, in a channel width direction, the transistors might exhibit different current drive capabilities.

Even if the transistors have identical channel widths and identical channel lengths, a difference occurs between the current drive capabilities of the transistors due to a variation in a distance between the one transistor and the other active area located adjacent to the one active area in which the one transistor is provided. Hereinafter, how this difference occurs will be described in detail with reference to FIG. 10. FIG. 10 is a plan view illustrating the layout for circuit simulation of the conventional semiconductor circuit device.

As shown in FIG. 10, three kinds of P-channel transistors TrpA, TrpB and TrpC have identical channel lengths and identical channel widths Wp. Three kinds of N-channel transistors TrnA, TrnB and TrnC also have identical channel lengths and identical channel widths Wn. A distance DpA between an active area RtpA, in which the transistor TrpA is located, and an N-type substrate active area 104 is equal to a distance DpC between an active area RtpC, in which the transistor TrpC is located, and the N-type substrate active area 104, while the distance DpA is different from a distance DpB between an active area RtpB, in which the transistor TrpB is located, and the N-type substrate active area 104. A distance DpnA between the active area RtpA and an active area RtnA is different from a distance DpnB between the active area RtpB and an active area RtnB. A distance DpnC between the active area RtpC and an active area RtnC is equal to the distance DpnB between the active area RtpB and the active area RtnB. A distance DnA between the active area RtnA and a P-type substrate active area 105 is equal to a distance DnB between the active area RtnB and the P-type substrate active area 105. And a distance DnC between the active area RtnC and the P-type substrate active area 105 is different from the distance DnA and the distance DnB.

In the above-described layout, the characteristics of the transistors TrpA through TrpC and the transistors TrnA through TrnC will be compared.

First, a comparison is made between the characteristic of the P-channel transistor TrpA and that of the P-channel transistor TrpB. The characteristic of the P-channel transistor TrpA facing the N-channel transistor TrnA in a Y-direction is determined by the channel length and the channel width Wp of the P-channel transistor TrpA, the distance DpA and the distance DpnA. The characteristic of the P-channel transistor TrpB facing the N-channel transistor TrnB in the Y-direction is determined by the channel length and the channel width Wp of the P-channel transistor TrpB, the distance DpB and the distance DpnB. The distance DnA between the active area RtnA, in which the N-channel transistor TrnA is located, and the P-type substrate active area 105 is equal to the distance DnB between the active area RtnB, in which the N-channel transistor TrnB is located, and the P-type substrate active area 105. That is, the N-channel transistors TrnA and TrnB are located similarly with respect to the Y-direction in the cell 100. In this layout, the following formulas $$DpA \neq DpB$$

$$DpnA \neq DpnB$$

hold true. In the Y-direction, the distance DpnA between the active area in which the P-channel transistor TrpA is located and another active area located adjacent thereto is different from the distance DpnB between the active area in which the P-channel transistor TrpB is located and another active area located adjacent thereto. Therefore, different trench isolation stresses are applied to the channel regions of the two P-channel transistors TrpA and TrpB. As a result, a difference occurs between the characteristics, e.g., the current drive capabilities, of the two P-channel transistors TrpA and TrpB. Even though the two NMIS active areas facing the two PMIS active areas are located similarly with respect to the Y-direction, the PMIS active areas are located differently with respect to the Y-direction. Therefore, the characteristics, e.g., the current drive capabilities, of the P-channel transistors located in the two PMIS active areas are varied in accordance with the distances between the PMIS active areas and the NMIS active areas in the Y-direction.

Next, a comparison is made between the characteristic of the P-channel transistor TrpA and that of the P-channel transistor TrpC. The characteristic of the P-channel transistor TrpC facing the N-channel transistor TrnC in the Y-direction is determined by the channel length and the channel width Wp of the P-channel transistor TrpC, the distance DpC and the distance DpnC. The distance DpA between the active area RtpA, in which the P-channel transistor TrpA is located, and the N-type substrate active area 104 is equal to the distance DpC between the active area RtpC, in which the P-channel transistor TrpC is located, and the N-type substrate active area 104. That is, the P-channel transistors TrpA and TrpC are located similarly with respect to the Y-direction in the cell 100. Therefore, the following formula $$DpA = DpC$$

holds true. However, the following formula $$DpnA \neq DpnC$$

also holds true. In the Y-direction, the distance DpnA between the active area in which the P-channel transistor TrpA is located and another active area located adjacent thereto is different from the distance DpnC between the active area in which the P-channel transistor TrpC is located and another active area located adjacent thereto. Therefore, different trench isolation stresses are applied to the channel regions of the two P-channel transistors TrpA and TrpC. As a result, a difference occurs between the characteristics, e.g., the current drive capabilities, of the two P-channel transistors TrpA and TrpC. Even though the two PMIS active areas are located similarly with respect to the Y-direction, the NMIS active areas facing the PMIS active areas are located differently with respect to the Y-direction. Therefore, the characteristics, e.g., the current drive capabilities, of the P-channel transistors located in the two PMIS active areas are varied in accordance with the distances between the PMIS active areas and the NMIS active areas in the Y-direction.

Next, a comparison is made between the characteristic of the P-channel transistor TrpB and that of the P-channel transistor TrpC. The distance DpnB between the active area RtpB, in which the P-channel transistor TrpB is located, and the active area RtnB, in which the N-channel transistor TrnB is located, is equal to the distance DpnC between the active area RtpC, in which the P-channel transistor TrpC is located, and the active area RtnC, in which the N-channel transistor TrnC is located. However, the distance DpB between the active area RtpB, in which the P-channel transistor TrpB is located, and the N-type substrate active area 104 is different from the distance DpC between the active area RtpC, in which the P-channel transistor TrpC is located, and the N-type substrate active area 104. Since the following formula $$DpB \neq DpC$$

holds true, different trench isolation stresses are applied from the N-type substrate active area 104 to the P-channel transistors TrpB and TrpC, resulting in a difference between the characteristics of the transistors. Even though distances between the PMIS active areas, in which the two P-channel transistors are located, and the NMIS active areas facing the PMIS active areas in the Y-direction are identical, the characteristics, e.g., the current drive capabilities, of the P-channel transistors are varied if the active areas, in which the two P-channel transistors are provided, are located differently with respect to the Y-direction.

Although the description of the characteristic variations of the N-channel transistors are omitted, the characteristic variations of the N-channel transistors are similar to those of the P-channel transistors in that the greater the trench isolation stress in a channel region, the lower the current drive capability.

As described above, it can be understood that even if the conventional semiconductor circuit device is designed to allow the transistors to have identical channel lengths and identical channel widths, the characteristics of the transistors having identical channel widths in the cell 100 are considerably varied due to the trench isolation stress, thus making it difficult to realize the optimum LSI design.

Furthermore, in a method for extracting model parameters of a conventional transistor model, transistor characteristic variations due to the trench isolation stress cannot be taken into consideration in the transistor model itself, and therefore, the transistor characteristic variations in each cell cannot be reproduced, which increases errors in circuit simulation for each cell.

SUMMARY OF THE INVENTION

An object of the present invention is to provide a semiconductor circuit device that does not fall significantly short of the design goal and a circuit simulation method for the circuit device, by focusing attention on the fact that the characteristic, e.g., the current drive capability, of a transistor varies due to a strain existing in an active area and by realizing a layout in which the characteristic variation is utilized.

An inventive semiconductor circuit device includes a cell in which MIS transistors are provided in a plurality of active areas surrounded by a trench isolation, wherein the cell includes: a plurality of PMIS active areas each provided with a gate of at least one P-channel transistor and arranged in a channel length direction; and a plurality of NMIS active areas each provided with a gate of at least one N-channel transistor and arranged in a channel length direction, wherein the plurality of PMIS active areas and the plurality of NMIS active areas are located to face each other in a channel width direction, and wherein the semiconductor circuit device is designed such that the ends of at least one plurality of active areas, facing the other plurality of active areas, are aligned substantially on a single straight line, the one plurality of active areas and the other plurality of active areas being the plurality of PMIS active areas and the plurality of NMIS active areas, respectively, or being the plurality of NMIS active areas and the plurality of PMIS active areas, respectively.

Thus, even if the semiconductor circuit device is miniaturized and the packing density thereof is increased, stresses applied from the trench isolation to channel regions under the gates provided in the areas, in which MISFETs are formed, are made uniform. Therefore, variations in current drive capabilities of the transistors due to variations in the stresses are reduced. Consequently, it becomes possible to obtain the semiconductor circuit device whose characteristics approximately meet the desired design goal.

As the one plurality of active areas, at least three or more active areas are preferably provided.

The semiconductor circuit device is preferably designed such that the channel width of each transistor formed in the one plurality of active areas is 1.0 μm or less.

The semiconductor circuit device is preferably designed such that a distance between each of the PMIS active areas and each of the NMIS active areas in the channel width direction is 0.8 μm or less.

At least one active area of the other plurality of active areas may be a dummy active area in which a gate of a transistor is not provided.

Two or more active areas of the other plurality of active areas may be facing one active area of the one plurality of active areas.

An inventive circuit simulation method for a semiconductor circuit device including a cell in which MIS transistors are provided in a plurality of active areas surrounded by a trench isolation includes the steps of: a) designing a layout including a plurality of first active areas for the MIS transistors, each provided with a gate of at least one transistor and arranged in a channel length direction, and a plurality of second active areas located to face the plurality of first active areas in a channel width direction of the gate and arranged in a channel length direction of the gate; b) storing the layout, which has been designed in the step a), in a cell library; and c) extracting, from the cell library, a model parameter of each transistor in accordance with a channel length and a channel width of each transistor in the first active area and a distance between the first and second active areas in the channel width direction, and simulating the circuit operation of the semiconductor circuit device.

In this method, in designing a semiconductor circuit device that is miniaturized and increased in packing density, stresses applied from the trench isolation to channel regions under the gates provided in the areas, in which MISFETs are formed, are made uniform. Therefore, variations in current drive capabilities of the transistors due to variations in the stresses are reduced. Consequently, the accuracy of the design can be improved.

In the step a), the layout is preferably designed such that the ends of at least one plurality of active areas, facing the other plurality of active areas, are aligned substantially on a single straight line, the one plurality of active areas and the other plurality of active areas being the plurality of first active areas and the plurality of second active areas, respectively, or being the plurality of second active areas and the plurality of first active areas, respectively.

As the one plurality of active areas, at least three or more active areas are preferably laid out.

In the step a), the layout is preferably designed such that the channel width of each transistor formed in the first active area is 1.0 µm or less.

In the step a), the layout is preferably designed such that the distance between the first and second active areas in the channel width direction is 1.0 µm or less. In the step a), the layout is more preferably designed such that the distance between the first and second active areas in the channel width direction is 0.6 µm or less.

In the step a), the layout is preferably designed such that a gate of a MIS transistor of a conductivity type opposite to that of each transistor in the first active area is provided in at least one of the plurality of second active areas.

In the step a), the layout may be designed such that at least one of the plurality of second active areas is formed as a dummy active area in which a gate of a transistor is not provided.

In the step a), the layout is preferably designed such that two or more of the second active areas face one of the plurality of first active areas.

DESCRIPTION OF THE PREFERRED EMBODIMENTS

Embodiment 1

Figure 1:
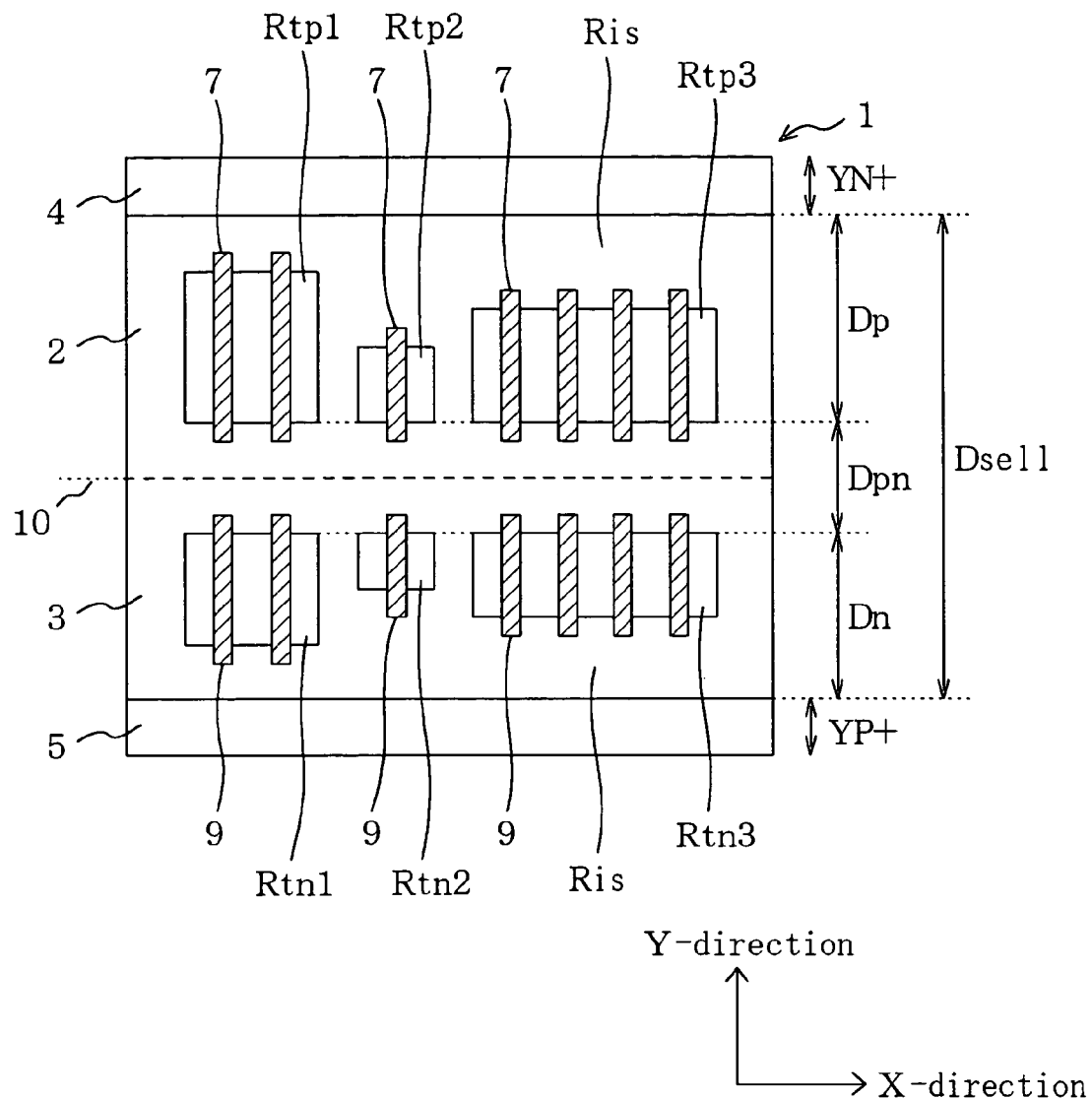
FIG. 1 is a plan view schematically illustrating the layout of a cell of a semiconductor circuit device according to a first embodiment of the present invention.

FIG. 1 is a plan view schematically illustrating the layout of a cell 1 of a semiconductor circuit device according to a first embodiment of the present invention.

As shown in FIG. 1, a semiconductor substrate is provided with an N-well 2 and a P-well 3 that are adjacent to each other with a well boundary 10 located therebetween. The N-well 2 is provided with first through third PMIS active areas Rtp1 through Rtp3 surrounded by a trench isolation Ris. On the other hand, the P-well 3 is provided with first through third NMIS active areas Rtn1 through Rtn3 surrounded by the trench isolation Ris. Herein, the "PMIS active area" refers to an active area for a P-channel MIS transistor, while the "NMIS active area" refers to an active area for an N-channel MIS transistor. Although an example in which three active areas are provided in each of the N-well 2 and the P-well 3 is shown in FIG. 1, a considerably large number of active areas are provided in an actual semiconductor circuit device. The first, second and third PMIS active areas Rtp1, Rtp2 and Rtp3 are provided with gates 7 of P-channel transistors. On the other hand, the first, second and third NMIS active areas Rtn1, Rtn2 and RTn3 are provided with gates 9 of N-channel transistors. It should be noted that, like a known transistor, each gate has a so-called "insulated gate structure" formed by a gate insulating film and a gate electrode, although not shown.

The semiconductor substrate is further provided with: an N-type substrate active area 4 through which a power supply voltage is supplied to respective elements in the cell 1; and a P-type substrate active area 5 through which a reference electric potential is supplied to respective elements in the cell 1.

Parts of each active area, located on the sides of each gate, are defined as source/drain regions. Upon application of voltage between the source/drain regions and application of bias to each gate, a channel is formed in a part of each active area, located under each gate, and an electric current flows through the channel.

The trench isolation Ris is formed in the N-well 2 and the P-well 3 except the first through third PMIS active areas Rtp1 through Rtp3 and the first through third N-type active areas Rtn1 through Rtn3.

Since various cells are generally combined in an LSI, a distance between a width YN+ of the N-type substrate active area 4 extending in a Y-direction and a width YP+ of the P-type substrate active area 5 extending in the Y-direction, i.e., a distance Dsell between the N-type substrate active area 4 and the P-type substrate active area 5, is standardized at a common value for a group of cells that are adjacently combined at least in an X-direction.

The features of the semiconductor circuit device of the present embodiment will be described below.

The locations of the first through third PMIS active areas Rtp1 through Rtp3 in the Y-direction are each standardized at a common value for a group of cells that are adjacently combined in the X-direction such that a distance Dp between the sides of the active areas Rtp1 through Rtp3, located closer to the well boundary 10, and the N-type substrate active area 4 becomes constant irrespective of the size of each of the active areas Rtp1 through Rtp3. On the other hand, the locations of the first through third NMIS active areas Rtn1 through Rtn3 in the Y-direction are each standardized at a common value for a group of cells that are adjacently combined in the X-direction such that a distance Dn between the sides of the active areas Rtn1 through Rtn3, located closer to the well boundary 10, and the P-type substrate active area 5 becomes constant irrespective of the size of each of the active areas Rtn1 through Rtn3. In particular, in the present embodiment, the ends of the first through third PMIS active areas Rtp1 through Rtp3 facing the first through third NMIS active areas Rtn1 through Rtn3 (i.e., the inner ends of the first through third PMIS active areas Rtp1 through Rtp3) are designed such that these ends are aligned substantially on a single straight line. On the other hand, the ends of the first through third NMIS active areas Rtn1 through Rtn3 facing the first through third PMIS active areas Rtp1 through Rtp3 (i.e., the inner ends of the first through third NMIS active areas Rtn1 through Rtn3) are designed such that these ends are aligned substantially on a single straight line. Consequently, the layout is designed such that a distance Dpn between the first through third NMIS active areas Rtn1 through Rtn3 and the first through third PMIS active areas Rtp1 through Rtp3 in the Y-direction substantially becomes a fixed value.

Described in detail below is the characteristic of each transistor in the cell 1 of the semiconductor circuit device according to the present embodiment formed as described above.

Transistor Model in Semiconductor Circuit Device of First Embodiment

Figure 2:
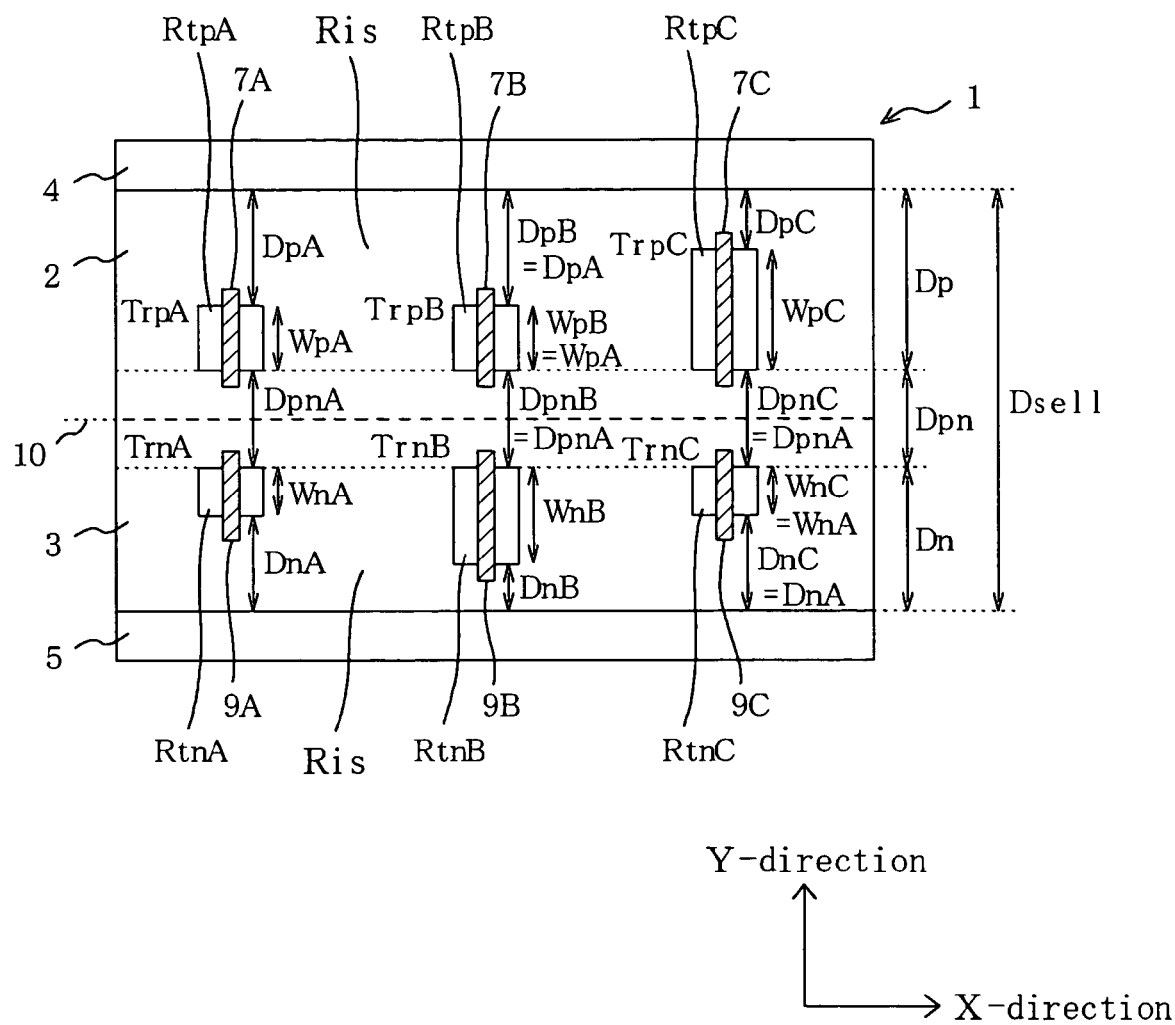
FIG. 2 is a plan view illustrating a layout used in circuit simulation for the semiconductor circuit device of the first embodiment.

FIG. 2 is a plan view illustrating a layout used in circuit simulation for the semiconductor circuit device of the first embodiment.

As shown in FIG. 2, a semiconductor substrate is provided with an N-well 2 and a P-well 3 that are adjacent to each other with a well boundary 10 located therebetween. The N-well 2 is provided with first through third PMIS active areas RtpA through RtpC surrounded by a trench isolation Ris. On the other hand, the P-well 3 is provided with first through third NMIS active areas RtnA through RtnC surrounded by the trench isolation Ris. The first, second and third PMIS active areas RtpA, RtpB and RtpC are provided with gates 7A, 7B and 7C of P-channel transistors TrpA, TrpB and TrpC, respectively. On the other hand, the first, second and third NMIS active areas RtnA, RtnB and RtnC are provided with gates 9A, 9B and 9C of N-channel transistors TrnA, TrnB and TrnC, respectively. It should be noted that, like a known transistor, each gate has a so-called "insulated gate structure" formed by a gate insulating film and a gate electrode, although not shown.

The semiconductor substrate is further provided with: an N-type substrate active area 4 through which a power supply voltage is supplied to respective elements in a cell 1; and a P-type substrate active area 5 through which a reference electric potential is supplied to the respective elements in the cell 1.

The three kinds of P-channel transistors TrpA, TrpB and TrpC have identical channel lengths. A channel width WpA of the transistor TrpA is equal to a channel width WpB of the transistor TrpB. The three kinds of N-channel transistors TrnA, TrnB and TrnC also have identical channel lengths, and a channel width WnA of the transistor TrnA is equal to a channel width WnC of the transistor TrnC.

A distance DpA between the active area RtpA, in which the transistor TrpA is located, and the N-type substrate active area 4 is equal to a distance DpB between the active area RtpB, in which the transistor TrpB is located, and the N-type substrate active area 4. On the other hand, the distance DpA between the active area RtpA and the N-type substrate active area 4 (and the distance DpB between the active area RtpB and the N-type substrate active area 4) is/are different from a distance DpC between the active area RtpC, in which the transistor TrpC is located, and the N-type substrate active area 4. Furthermore, in the cell 1, a distance Dsell between the N-type substrate active area 4 and the P-type substrate active area 5, a distance Dp between the N-type substrate active area 4 and the sides of the active areas RtpA, RtpB and RtpC (in which the transistors associated thereto are located) facing the well boundary 10, and a distance Dn between the P-type substrate active area 5 and the sides of the active areas RtnA, RtnB and RtnC (in which the transistors associated thereto are located) facing the well boundary 10 are each standardized at a common value.

That is, a distance DpnA between the active areas RtpA and RtnA, a distance DpnB between the active areas RtpB and RtnB, and a distance DpnC between the active areas RtpC and RtnC are all set at the same value Dpn.

A distance DnA between the active area RtnA, in which the transistor TrnA is located, and the P-type substrate active area 5 is equal to a distance DnC between the active area RtnC, in which the transistor TrnC is located, and the P-type substrate active area 5. A distance DnB between the active area RtnB, in which the transistor TrnB is located, and the P-type substrate active area 5 is different from the distance DnA and the distance DnC.

In the above-described layout, the characteristics of the transistors TrpA through TrpC and the transistors TrnA through TrnC will be compared.

First, a comparison is made between the characteristics of the P-channel transistors TrpA and TrpB having identical channel widths. The characteristic of the P-channel transistor TrpA facing the N-channel transistor TrnA in a Y-direction is determined by the channel length and the channel width WpA of the P-channel transistor TrpA, the distance DpA and the distance DpnA. The characteristic of the P-channel transistor TrpB facing the N-channel transistor TrnB in the Y-direction is determined by the channel length and the channel width WpB of the P-channel transistor TrpB, the distance DpB and the distance DpnB. Since the N-channel transistors TrnA and TrnB have mutually different channel widths WnA and WnB, the distances DnA and DnB are different from each other; however, the distances DpnA and DpnB are still equal to each other. Therefore, the following formulas DpA=DpB DpnA=DpnB hold true. That is, the distance DpA between the active area, in which the P-channel transistor TrpA is located, and the N-type substrate active area 4 in the Y-direction is equal to the distance DpB between the active area, in which the P-channel transistor TrpB is located, and the N-type substrate active area 4 in the Y-direction. In addition, the distance DpnA between the active area, in which the P-channel transistor TrpA is located, and the active area adjacent thereto in the Y-direction is equal to the distance DpnB between the active area, in which the P-channel transistor TrpB is located, and the active area adjacent thereto in the Y-direction. Accordingly, a difference does not occur between the trench isolation stresses applied to the channel regions of the two P-channel transistors TrpA and TrpB. That is, even if the channel widths of the N-channel transistors provided in the NMIS active areas facing the two PMIS active areas are different from each other, the characteristics, e.g., the current drive capabilities, of the P-channel transistors provided in the PMIS active areas do not vary.

Similarly, if a comparison is made between the characteristic of the N-channel transistor TrnA and that of the N-channel transistor TrnC, it can be understood that the characteristics of the transistors TrnA and TrnC are not affected at all even if the channel widths WpA and WpC of the P-channel transistors TrpA and TrpC facing the transistors TrnA and TrnC in the Y-direction are different from each other.

On the other hand, if a comparison is made between the characteristic of the P-channel transistor TrpA and that of the P-channel transistor TrpC, it can be seen that the distances DpA and DpC are different from each other because the channel widths WpA and WpC of the transistors TrpA and TrpC are different from each other. Accordingly, the channel regions of the transistors TrpA and TrpC suffer different trench isolation stresses from the N-type substrate active area 4. However, since the channel widths of the transistors TrpA and TrpC are originally different from each other, the characteristics of the transistors TrpA and TrpC are naturally different from each other, and therefore, the effects of the present invention is not adversely affected at all.

As described above, according to the present embodiment, the trench isolation stress applied in the channel width direction of each transistor is not affected by the layout around each active area in which the transistor associated thereto is located, and the trench isolation stress is uniquely determined by only the channel width of the transistor itself. Therefore, it becomes possible to obtain a high-performance semiconductor circuit device in which the variations in the characteristics of the transistors having identical channel widths in the cell, which are caused by the trench isolation stress, are reduced.

Figure 6:
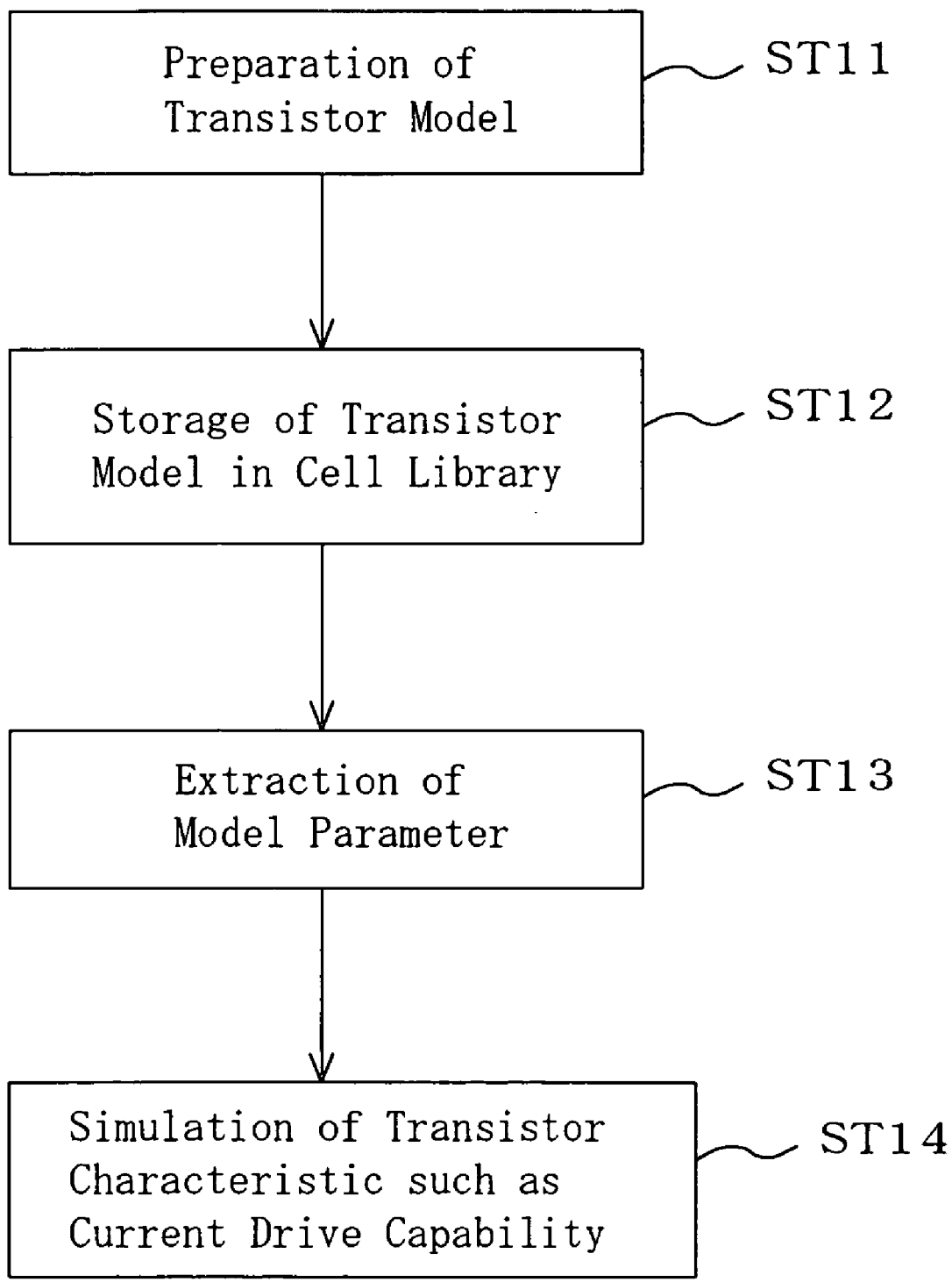
FIG. 6 is a flowchart illustrating the procedure of circuit simulation for the inventive semiconductor circuit device.

FIG. 6 is a flowchart illustrating the procedure of circuit simulation for the inventive semiconductor circuit device.

First, in Step ST11, a transistor model that is shown in FIG. 2, for example, and is used in circuit simulation is prepared, and in Step ST12, the transistor model is stored in a cell library. Next, in Step ST13, model parameters are extracted. The model parameters include the channel length and channel width of each transistor, and distances Dpn, DpA, DpB, DpC, DnA, DnB, DnC and Dsell, for example.

Figure 7:
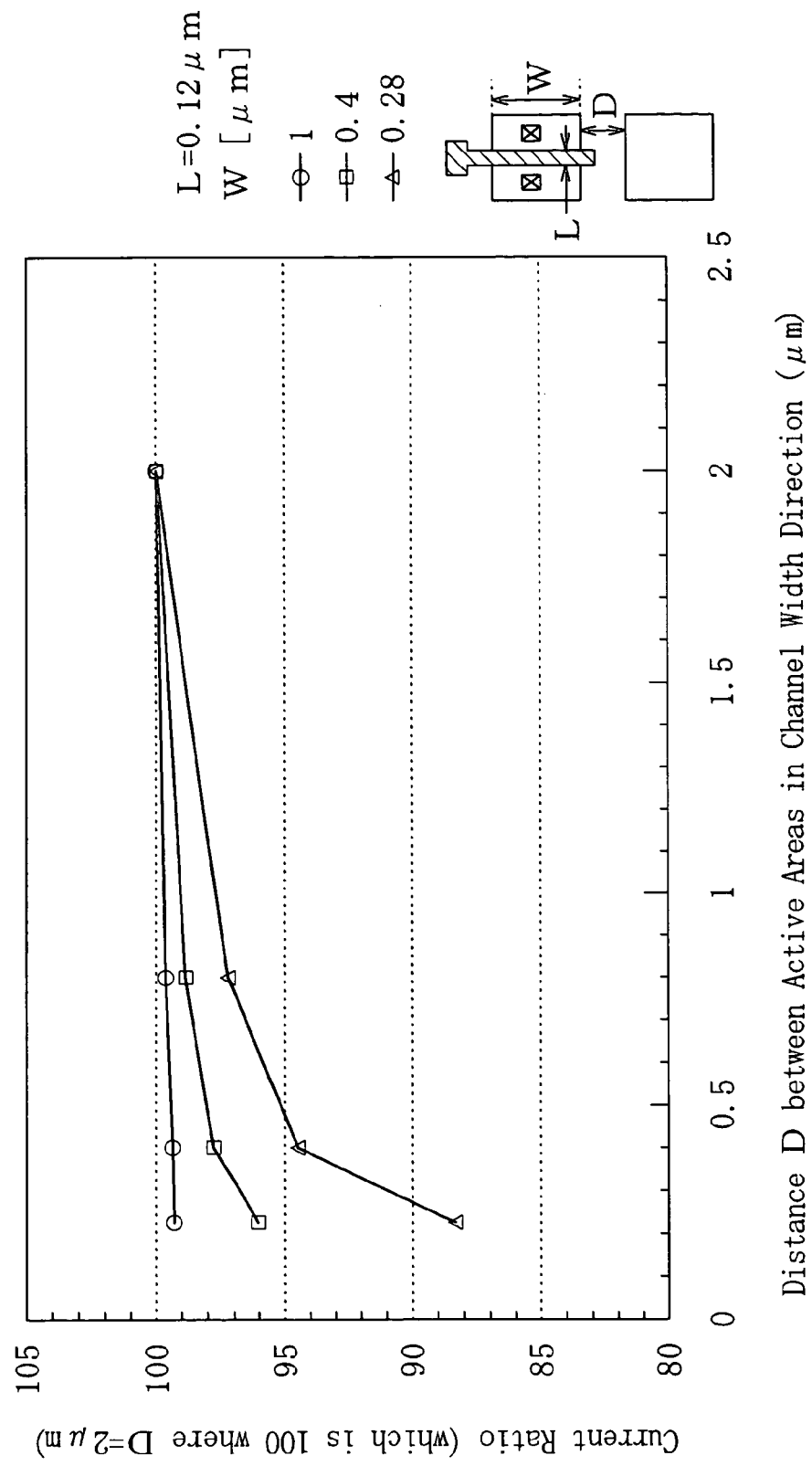
FIG. 7 shows data indicating the dependency of the current drive capability of a transistor on a distance between active areas in a gate width direction.
Figure 8:
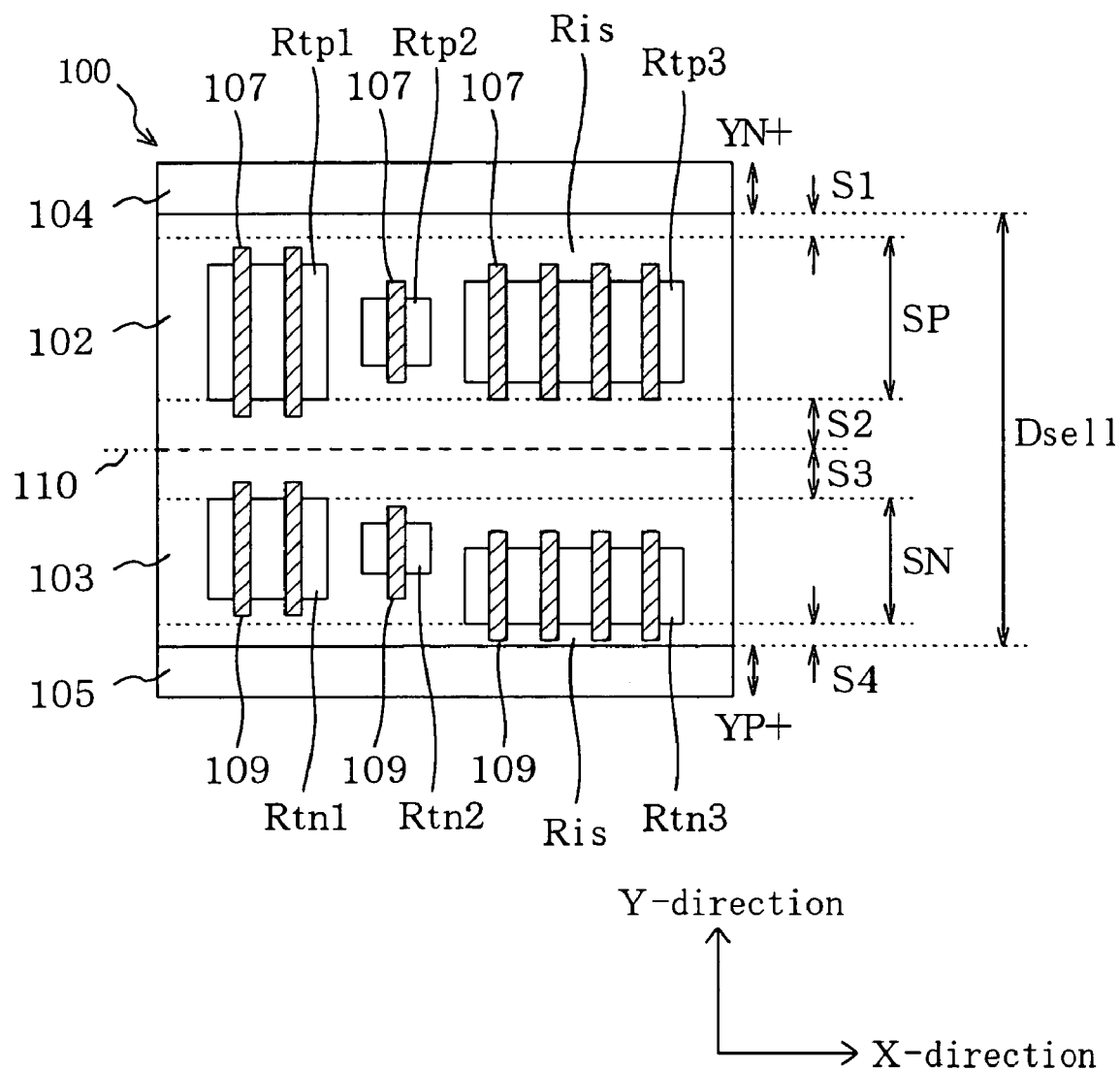
FIG. 8 is a plan view schematically illustrating an exemplary layout of a conventional cell provided in a part of a semiconductor substrate.
Figure 9:
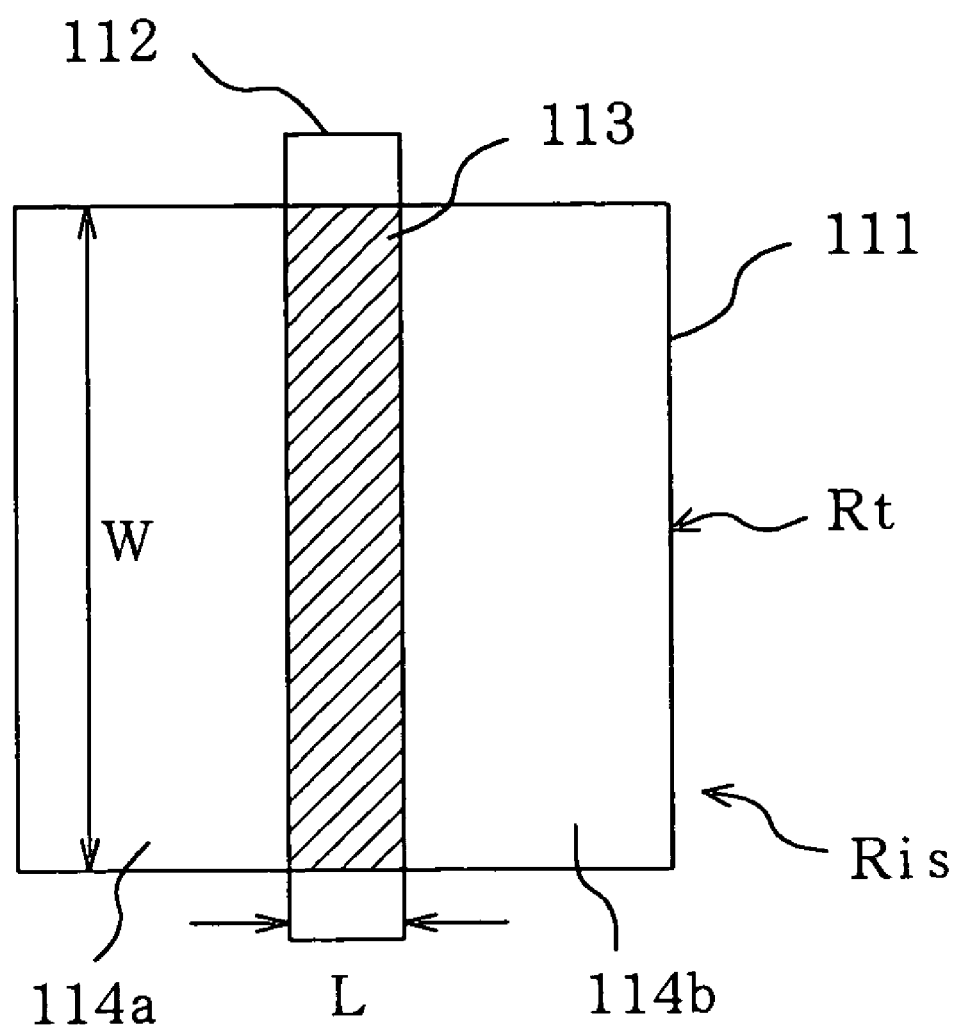
FIG. 9 is a diagram schematically illustrating the structure of a transistor for the description of a conventional transistor model.
Figure 10:
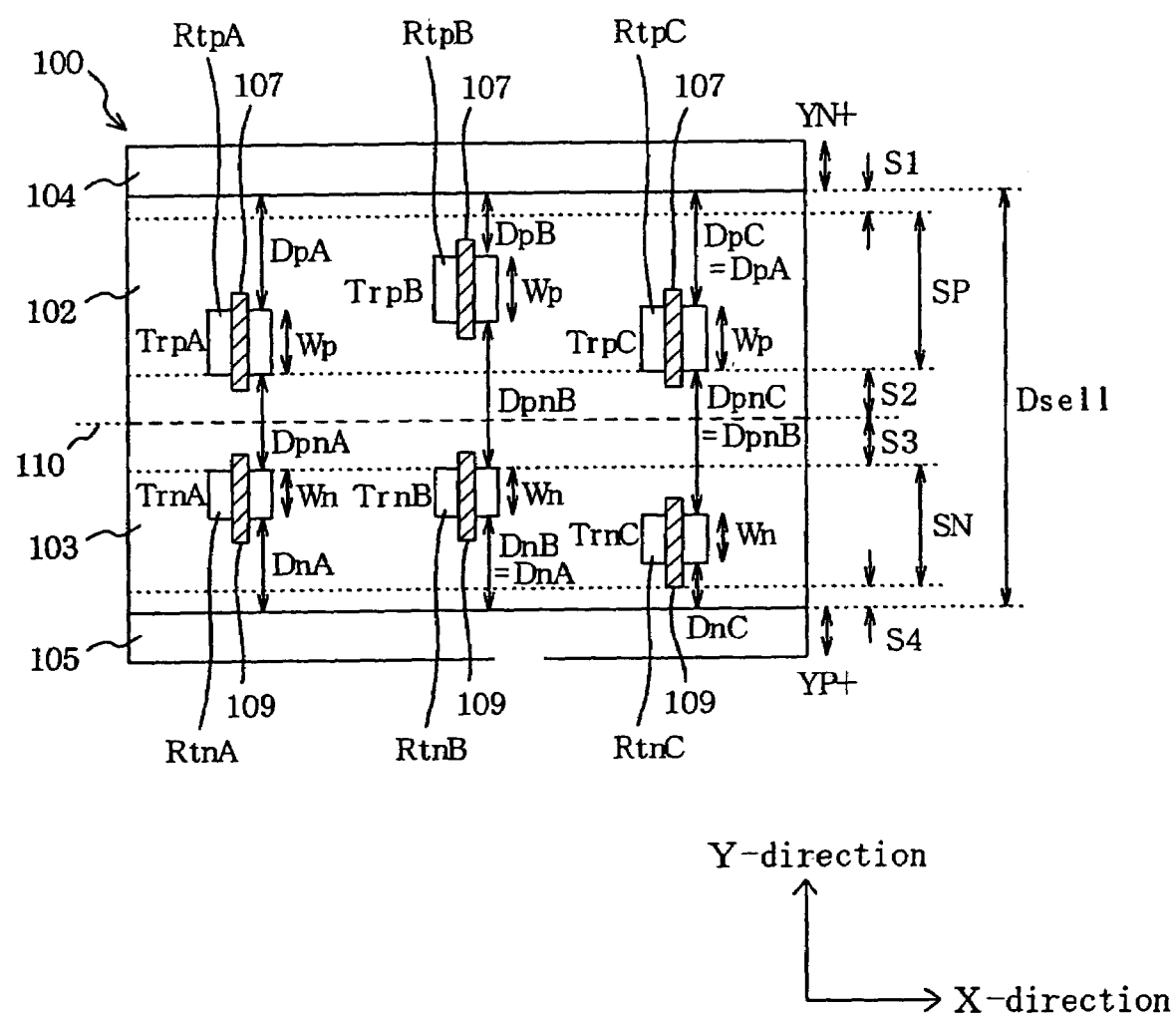
FIG. 10 is a plan view illustrating a layout for circuit simulation of a conventional semiconductor circuit device.

Thereafter, by using the extracted model parameters, the circuit simulation is carried out to determine the circuit operation defined by, for example, the current drive capability and operation speed of each transistor FIG. 7 shows data obtained by the experiment carried out by the present inventors. The data indicate the dependency of the current drive capability of a transistor on a distance between active areas in a gate width direction. The data shown in FIG. 7 are about three kinds of N-channel transistors having identical channel lengths L (0.12 µm) and having different channel widths W (1 µm, 0.4 µm and 0.28 µm, respectively). In FIG. 7, the abscissa represents a distance D between active areas in the channel width direction, and the ordinate represents a relative value of the current drive capability of each transistor as 100 where D=2 (µm). The data shown in FIG. 7 tell the dependency of the current drive capability of the transistor on the distance D where the channel length and channel width of each transistor are fixed.

The current drive capability of a transistor is reduced in accordance with the distance D if its channel width is 1.0 µm or less. First, in the transistor having a channel width of 1.0 µm, the reduction of the current drive capability is slight even if the distance D is small.

However, in the transistor having a channel width of 0.4 µm, the smaller the distance D, the greater the reduction of the current drive capability. Besides, the transistor having a channel width of 0.28 µm is more likely to suffer the effect of the distance D than the transistor having a channel width of 0.4 µm, and the smaller the distance D, the greater the reduction of the current drive capability even further. That is, the smaller the channel width, the greater the effect of the distance D, and the smaller the distance D, the greater the reduction of the current drive capability. Therefore, as the semiconductor circuit device is miniaturized and the packing density thereof is increased, the effect of the trench isolation stress is increased accordingly.

In designing the semiconductor circuit device, if the smallest channel width of the transistors is W, the distance between each PMIS active area and each NMIS active area in the channel width direction is preferably at a fixed value of ±0.5 W, and more preferably at a fixed value of ±0.2 W.

Specifically, if the dependency of the current drive capability on the distance D is great where the distance D is 0.8 µm or less, and a difference in the distance D exceeds 0.4 µm, variations in the relative current drive capability are increased. Therefore, in designing the semiconductor circuit device, the distance D is preferably at a fixed value of ±0.2 µm, and more preferably at a fixed value of ±0.1 µm or less.

Besides, the ends of the three or more PMIS active areas facing the three or more NMIS active areas (i.e., the inner ends of the thee or more PMIS active areas) are preferably designed such that these ends are aligned substantially on a single straight line. This is because the process of the circuit simulation can be simplified and thus the circuit simulation can be carried out speedily in such a layout. Similarly, the ends of the three or more NMIS active areas facing the three or more PMIS active areas (i.e., the inner ends of the thee or more NMIS active areas) are preferably designed such that these ends are aligned substantially on a single straight line.

Modification of Embodiment 1

Figure 3:
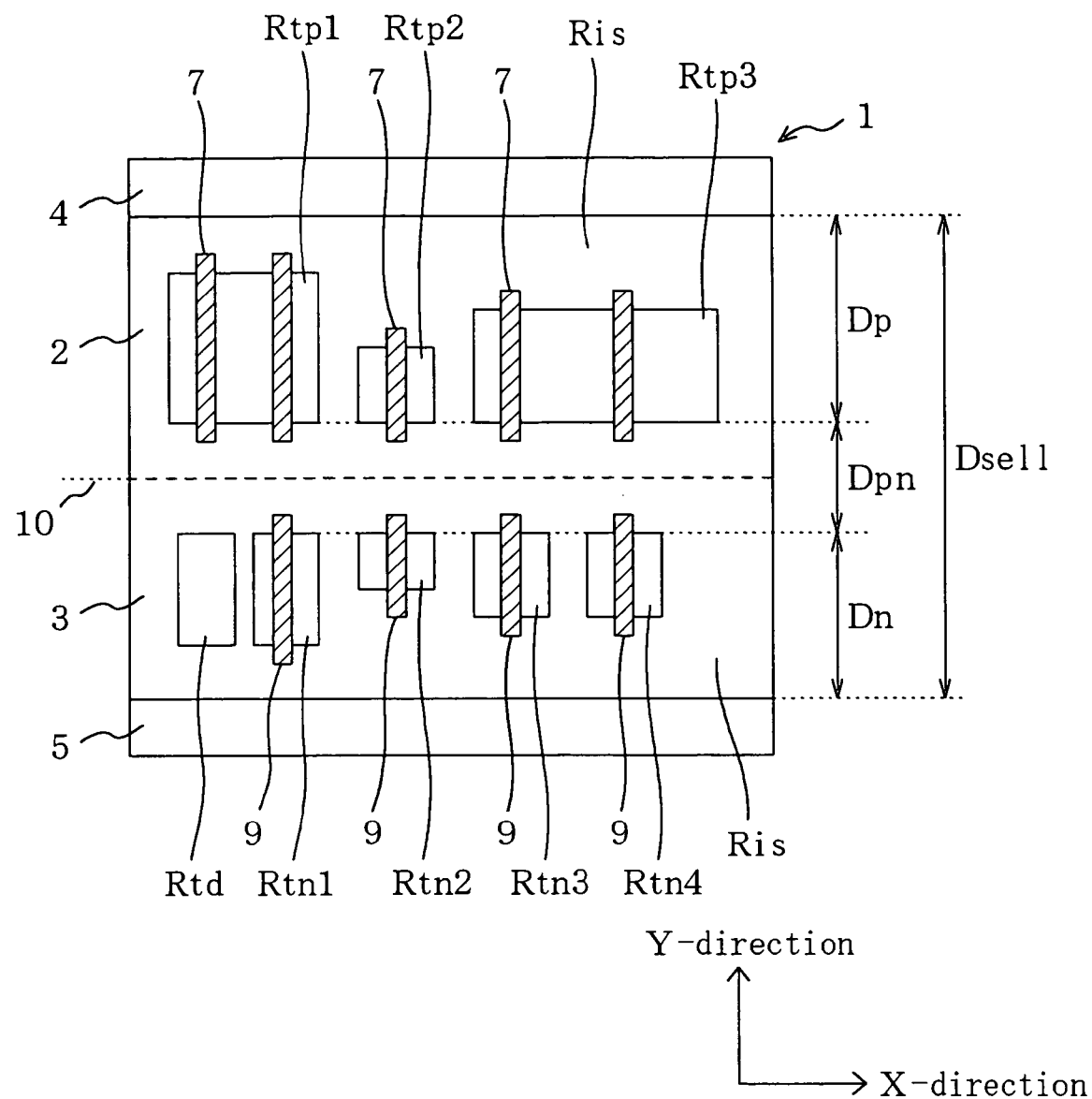
FIG. 3 is a plan view schematically illustrating the layout of a cell of a semiconductor circuit device according to a modification of the first embodiment.

FIG. 3 is a plan view schematically illustrating the layout of a cell 1 of a semiconductor circuit device according to a modification of the first embodiment.

As shown in FIG. 3, a semiconductor substrate is provided with an N-well 2 and a P-well 3 that are adjacent to each other with a well boundary 10 located therebetween. The N-well 2 is provided with first through third PMIS active areas Rtp1 through Rtp3 surrounded by a trench isolation Ris. On the other hand, the P-well 3 is provided with a dummy active region Rtd and first through fourth NMIS active areas Rtn1 through Rtn4 surrounded by the trench isolation Ris. The first through third PMIS active areas Rtp1 through Rtp3 are provided with gates 7 of P-channel transistors. On the other hand, the first through fourth NMIS active areas Rtn1 through RTn4 are provided with gates 9 of N-channel transistors; however, the dummy active area Rtd is provided with no transistor. It should be noted that, like a known transistor, each gate has a so-called "insulated gate structure" formed by a gate insulating film and a gate electrode, although not shown. The semiconductor substrate is further provided with: an N-type substrate active area 4 through which a power supply voltage is supplied to respective elements in the cell 1; and a P-type substrate active area 5 through which a reference electric potential is supplied to respective elements in the cell 1.

The locations of the first through third PMIS active areas Rtp1 through Rtp3 in a Y-direction are each standardized at a common value for a group of cells that are adjacently combined in an X-direction such that a distance Dp between the sides of the active areas Rtp1 through Rtp3, located closer to the well boundary 10, and the N-type substrate active area 4 becomes constant irrespective of the size of each of the active areas Rtp1 through Rtp3. On the other hand, the locations of the dummy active area Rtd and the first through fourth NMIS active areas Rtn1 through Rtn4 in the Y-direction are each standardized at a common value for a group of cells that are adjacently combined in the X-direction such that a distance Dn between the sides of the active areas Rtd and Rtn1 through Rtn4, located closer to the well boundary 10, and the P-type substrate active area 5 becomes constant irrespective of the size of each of the active areas Rtd and Rtn1 through Rtn4.

In this modification of the first embodiment, the first PMIS active area Rtp1 is provided with two gates of two P-channel MISFETs, and the dummy active area Rtd and the first NMIS active area Rtn1 are provided to face the two gates of the first PMIS active area Rtp1. That is, the cell 1 is designed such that identical trench isolation stresses are applied to the channel regions under the two gates in the first PMIS active areas due to the dummy active area Rtd and the first NIMIS active area Rtn1.

Two NMIS active regions, i.e., the third and fourth NMIMIS active areas Rtn3 and Rtn4, are provided to face the two gates in the third PMIS active area Rtp3 in the Y-direction. The third PMIS active area Rtp3 is provided with two gates 7 of two P-channel transistors, whereas the third and fourth NMIS active areas Rtn3 and Rtn4 are each provided with a gate 9 of an N-channel transistor. In this case, due to the third and fourth NMIS active areas Rtn3 and Rtn4, identical trench isolation stresses can also be applied to the channel regions under the two gates in the third PMIS active area Rtp3.

In the semiconductor circuit device of this modification of the first embodiment, a plurality of gates of transistors are provided in a single active area, and another active areas are provided at positions facing these gates in the Y-direction. Therefore, a substantially uniform trench isolation stress can be applied to the channel region of each transistor, and it becomes possible to suppress the transistor characteristic variations resulting from a considerable difference between the trench isolation stresses applied to the channel regions of the respective transistors. In other words, the effects similar to those of the first embodiment can be achieved.

In the example shown in FIG. 3, the description has been made on the supposition that a plurality of gates are provided in a PMIS active area. However, even if a plurality of gates are provided in an NMIS active area, the effects similar to those of the first embodiment can be achieved by dividing a PMIS active area into a plurality of parts and/or by providing a dummy active area arranged along with the PMIS active area in the X-direction.

Consequently, in the modification of the first embodiment, the effects can still be obtained even if the length of the PMIS active area Rtp in the X-direction is not equal to that of the NMIS active area Rtn in the X-direction, facing the PMIS active area Rtp in the Y-direction.

Embodiment 2

In the present embodiment, a method for extracting model parameters of a transistor model will be described.

Figure 4A:
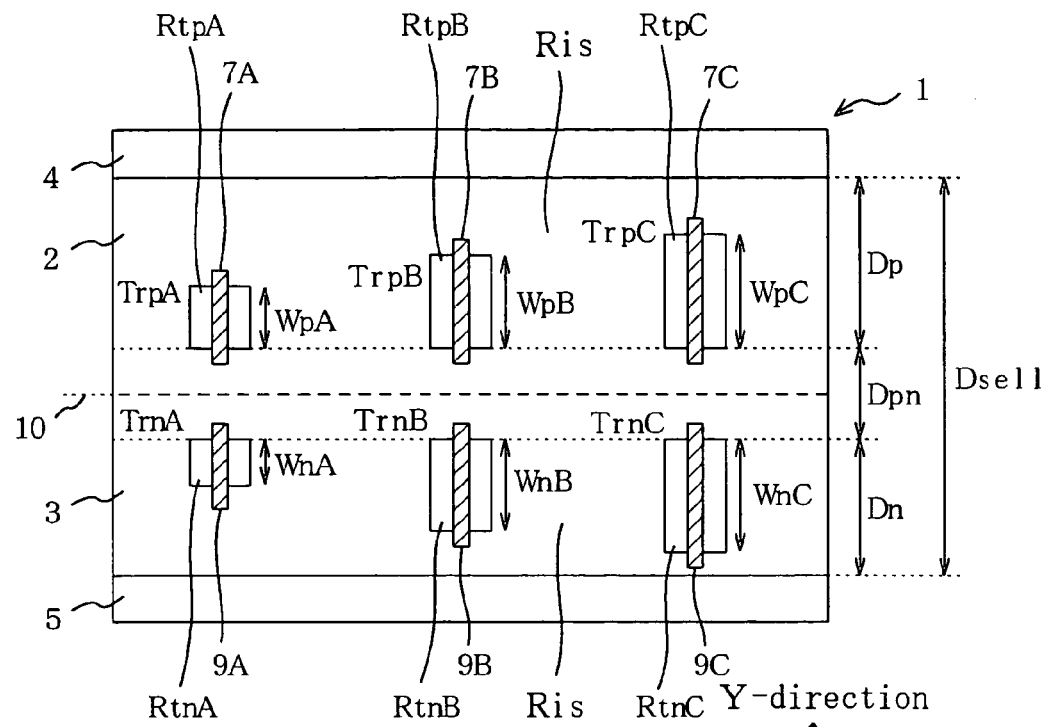
FIGS. 4A and 4B are a plan view illustrating the layout of a transistor model according to a second embodiment of the present invention, and a plan view illustrating the layout of a transistor model specialized for the extraction of model parameters of P-channel transistors, respectively.
Figure 4B:
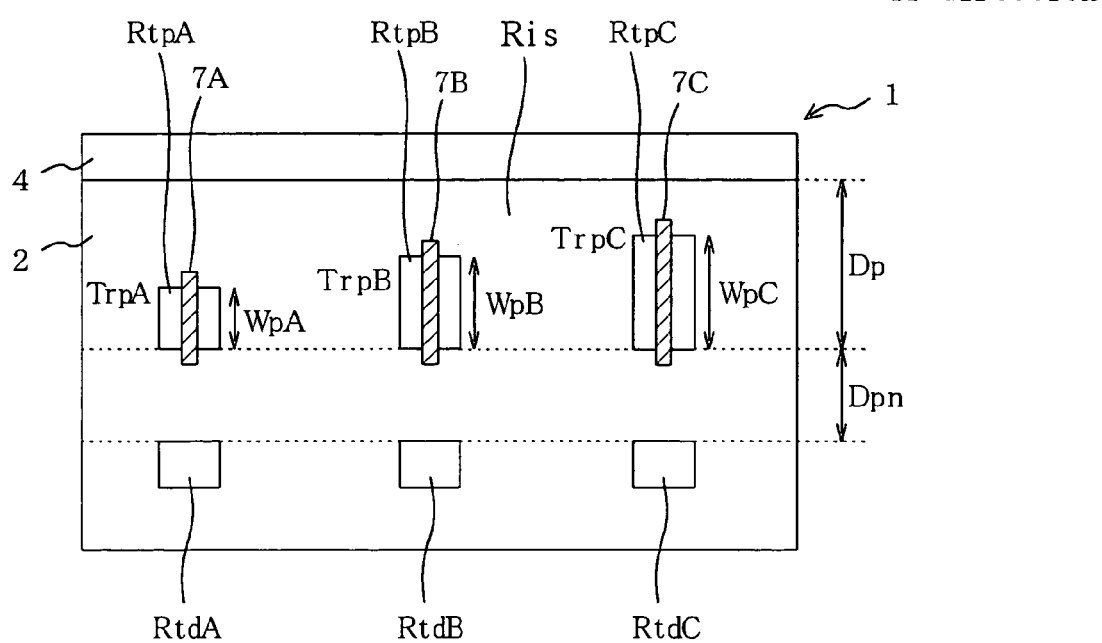

FIGS. 4A and 4B are a plan view schematically illustrating the layout of a cell including transistors for the extraction of model parameters according to a second embodiment of the present invention, and a plan view schematically illustrating the layout of transistors specialized for the extraction of model parameters of P-channel transistors, respectively.

FIG. 4A illustrates an exemplary layout of a cell for the extraction of model parameters of transistors formed substantially in the same manner as those described in the aforementioned first embodiment. As shown in FIG. 4A, a semiconductor substrate is provided with an N-well 2 and a P-well 3 that are adjacent to each other with a well boundary 10 located therebetween. The N-well 2 is provided with first through third PMIS active areas RtpA through RtpC surrounded by a trench isolation Ris. On the other hand, the P-well 3 is provided with first through third NMIS active areas RtnA through RtnC surrounded by the trench isolation Ris. The first, second and third PMIS active areas RtpA, RtpB and RtpC are provided with gates 7A, 7B and 7C of P-channel transistors TrpA, TrpB and TrpC, respectively. On the other hand, the first, second and third NMIS active areas RtnA, RtnB and RtnC are provided with gates 9A, 9B and 9C of N-channel transistors TrnA, TrnB and TrnC, respectively. It should be noted that, like a known transistor, each gate has a so-called "insulated gate structure" formed by a gate insulating film and a gate electrode, although not shown.

The semiconductor substrate is further provided with: an N-type substrate active area 4 through which a power supply voltage is supplied to respective elements in the cell 1; and a P-type substrate active area 5 through which a reference electric potential is supplied to respective elements in the cell 1.

The three kinds of P-channel transistors TrpA, TrpB and TrpC have identical channel lengths. However, the channel widths WpA, WpB and WpC of the transistors TrpA, TrpB and TrpC are mutually different such that WpA<WpB<WpC. The three kinds of N-channel transistors TrnA, TrnB and TrnC have identical channel lengths; however, the channel widths WnA, WnB and WnC of the transistors TrnA, TrnB and TrnC are mutually different such that WnA<WnB<WnC. That is, the transistor model includes P-channel transistors having three kinds of channel widths and N-channel transistors having three kinds of channel widths.

In the cell 1, a distance Dsell between the N-type substrate active area 4 and the P-type substrate active area 5, a distance Dp between the N-type substrate active area 4 and the sides of the active areas RtpA, RtpB and RtpC (in which the transistors associated thereto are located) facing the well boundary 10, and a distance Dn between the P-type substrate active area 5 and the sides of the active areas RtnA, RtnB and RtnC (in which the transistors associated thereto are located) facing the well boundary 10 are each standardized at a common value. That is, the distance between the active areas RtpA and RtnA, the distance between the active areas RtpB and RtnB, and the distance between the active areas RtpC and RtnC are all set at a common value Dpn.

As shown in FIG. 4A, transistors having at least one kind of channel length and channel width are needed to extract model parameters of a transistor model, and in particular, transistors having at least two or more kinds of channel widths are needed to extract parameters dependent on the channel widths.

FIG. 4B illustrates an exemplary layout of a cell specialized for the extraction of model parameters of P-channel transistors.

In the example shown in FIG. 4B, first, second and third PMIS active areas RtpA, RtpB and RtpC are provided with gates 7A, 7B and 7C of P-channel transistors TrpA, TrpB and TrpC, respectively. However, P-well, P-type substrate active area, and NMIS active areas in which N-channel transistors are located are not provided. Only first, second and third dummy active areas RtdA, RtdB and RtdC are provided instead of NMIS active areas.

Distances between the first, second and third PMIS active areas RtpA, RtpB and RtpC and the first, second and third dummy active areas RtdA, RtdB and RtdC are each set at a common value Dpn. Therefore, in the transistor model shown in FIG. 4B, the channel regions under the gates in the P-channel transistors TrpA, TrpB and TrpC suffer trench isolation stresses in the channel width direction in the same manner as in the transistor model shown in FIG. 4A. That is, as long as the rule that the distances between the PMIS active areas and the NMIS active areas are all set at a common value is followed as shown in FIG. 4A, the trench isolation stress applied in the channel width direction of each transistor can be uniquely determined by only the channel width of the transistor itself irrespective of the layout of the active region adjacent to the active area in which the associated transistor is located. Furthermore, if model parameters of transistors are extracted in accordance with the channel lengths, channel widths and distances D thereof and circuit simulation is carried out based on the model parameters as shown in FIG. 7, it becomes possible to determine the circuit operation in which the current drive capabilities of various transistors that should be classified based on the channel lengths and channel widths thereof are accurately reflected.

As described above, according to the present embodiment, the trench isolation stress applied in the channel width direction of each transistor can be uniquely determined by only the channel width of the transistor itself irrespective of the layout of the active area adjacent to the active area in which the associated transistor is located. Therefore, it becomes possible to easily and speedily extract model parameters as parameters dependent on the channel widths of the transistor model including the trench isolation stress applied in the channel width direction which is specific to each channel width.

Further, the transistor model parameters extracted by using the model parameter extraction method in the present embodiment may be applied to the circuit simulation for the semiconductor circuit device of the first embodiment. In that case, it becomes possible to suppress variations in the characteristics of a group of transistors having standardized channel widths in a cell which are caused by different trench isolation stresses, and thus it becomes possible to design the semiconductor circuit device with very high precision.

It should be noted that FIG. 4B illustrates the layout of transistors for the extraction of model parameters, which are specialized for the extraction of model parameters of P-channel transistors. However, instead of the P-channel transistors, dummy active areas each having a common distance D may be provided to face NMIS active areas in which various gates of N-channel transistors are located. In that case, it is possible to obtain the layout of a cell including transistors for model parameter extraction specialized for the extraction of model parameters of N-channel transistors.

Although the transistors for the extraction of model parameters are located on the same well for each channel polarity in FIG. 4B, the effects of the present embodiment is achievable even if the transistors are located on independent wells.

In FIG. 4A, the length of each PMIS active area Rtp in the X-direction does not have to be equal to that of each NMIS active area Rtn in the X-direction, facing the PMIS active area in the Y-direction.

In FIG. 4B, the length of each PMIS active area Rtp in the X-direction does not have to be equal to that of each dummy active area Rtd in the X-direction, facing the PMIS active area in the Y-direction.

The same goes for the layout of a cell specialized for the extraction of model parameters of N-channel transistors which can be provided with reference to FIG. 4B.

Embodiment 3

In the present embodiment, another method for extracting model parameters of a transistor model will be described.

Figure 5:
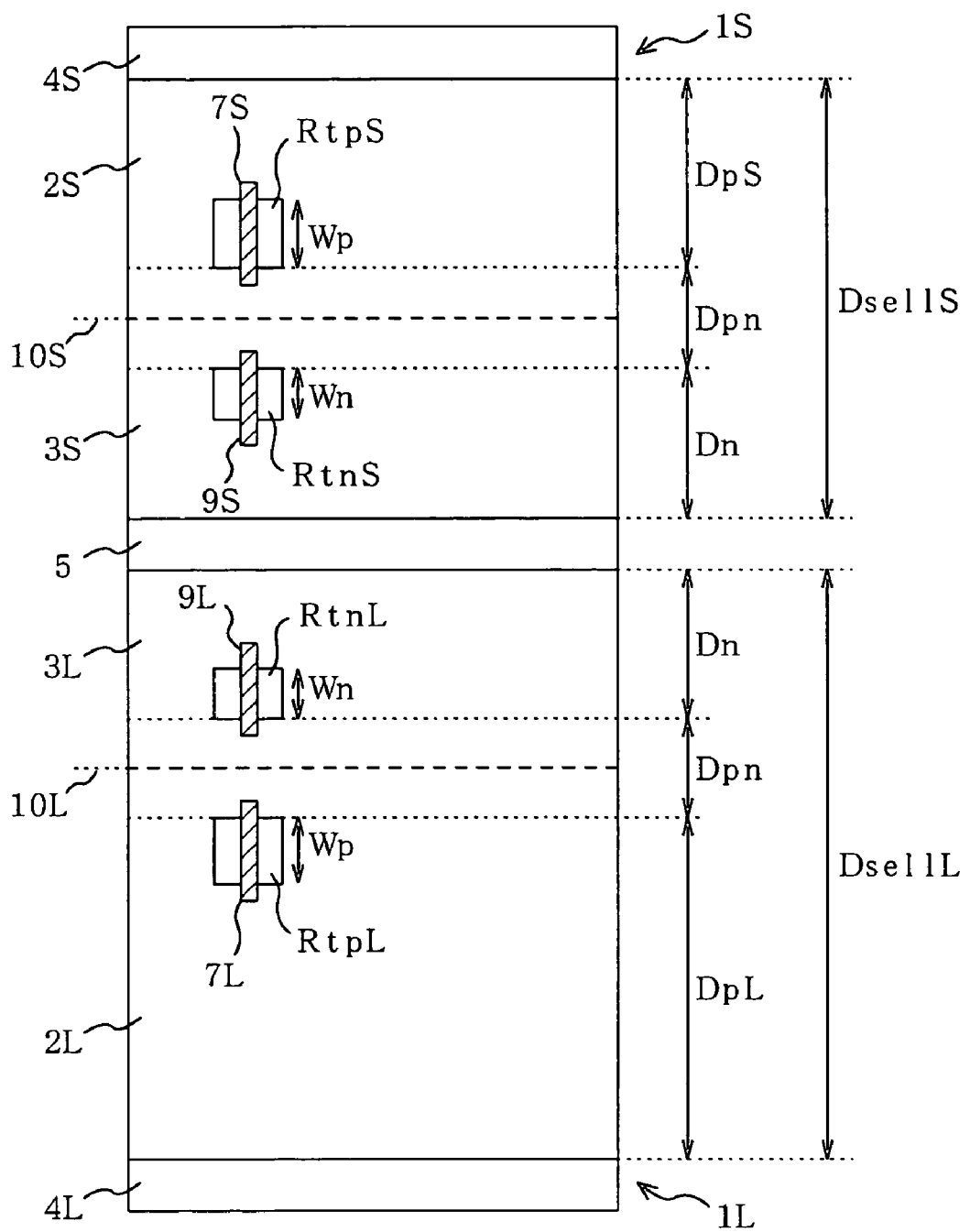
FIG. 5 is a plan view schematically illustrating the layout of a cell including transistors for the extraction of model parameters according to a third embodiment of the present invention.

FIG. 5 is a plan view schematically illustrating the layout of a cell including a transistor for the extraction of model parameters according to a third embodiment of the present invention.

As shown in FIG. 5, a semiconductor circuit device of the present embodiment includes two kinds of cells, i.e., a cell 1S and a cell 1L. Furthermore, a semiconductor substrate is provided with: an N-well 2S and a P-well 3S that are adjacent to each other with a well boundary 10S located therebetween; and an N-well 2L and a P-well 3L that are adjacent to each other with a well boundary 10L located therebetween. The N-well 2S is provided with a PMIS active area RtpS, while the P-well 3S is provided with an NMIS active area RtnS. The N-well 2L is provided with a PMIS active area RtpL, while the P-well 3L is provided with an NMIS active area RtnL. The PMIS active areas RtpS and RtpL are provided with gates 7S and 7L of P-channel transistors, respectively. On the other hand, the NMIS active areas RtnS and RtnL are provided with gates 9S and 9L of N-channel transistors, respectively. It should be noted that, like a known transistor, each gate has a so-called "insulated gate structure" formed by a gate insulating film and a gate electrode, although not shown.

The semiconductor substrate is further provided with: N-type substrate active areas 4S and 4L through which a power supply voltage is supplied to respective elements in the cells 1S and 1L; and a P-type substrate active area 5 through which a reference electric potential is supplied to respective elements in the cells 1S and 1L. The two kinds of cells 1S and 1L are provided so that the P-type substrate active area 5 is sandwiched therebetween.

The layout of each of the cells 1S and 1L in the present embodiment is provided in conformance with the layout of the cell in the first embodiment, and a distance DsellS between the N-type substrate active area 4S of the cell 1S and the P-type substrate active area 5 is different from a distance DsellL between the N-type substrate active area 4L of the cell 1L and the P-type substrate active area 5. A difference between the distances DsellS and DsellL corresponds to a difference between a distance DpS between the side of the PMIS active area RtpS of the cell 1S, located closer to the well boundary 10S, and the N-type substrate active area 4S and a distance DpL between the side of the PMIS active area RtpL of the cell 1L, located closer to the well boundary 10L, and the N-type substrate active area 4L. A distance between the PMIS active area RtpS and the NMIS active area RtnS and a distance between the PMIS active area RtpL and the NMIS active area RtnL are standardized at a common value Dpn. A distance between the side of the NMIS active area RtnS of the cell 1S, located closer to the well boundary 10S, and the P-type substrate active area 5 and a distance between the side of the NMIS active area RtnL of the cell 1L, located closer to the well boundary 10L, and the P-type substrate active area 5 are standardized at a common value Dn. Therefore, the N-channel transistors located in the cells 1S and 1L are affected similarly by the trench isolation stresses applied in the channel width direction, and if the channel lengths and channel widths are standardized at a common value, the characteristics of the N-channel transistors are also standardized. Since the P-channel substrate active area 5 is shared by the two cells 1S and 1L, the cells 1S and 1L are laid out axisymmetrically with respect to a line extending parallel to the X-direction. Further, the cells 1S and 1L are laid out in conformance with the layout of the cell in the first embodiment; therefore, the trench isolation stress applied to each transistor located in the cells 1S and 1L in the channel width direction is uniquely determined by the channel width of the transistor itself. In other words, the characteristic of the transistor located in one of the cells 1S and 1L is uniquely determined by the channel width of the transistor itself and is not affected by the layout of the other cell.

If the semiconductor circuit device is formed by mixedly providing a plurality of kinds of cells having mutually different distances Dsell as in the present embodiment shown in FIG. 5, model parameters are extracted for each group of transistors subjected to similar trench isolation stresses applied in the channel width direction, by using the method for extracting transistor model parameters according to the second embodiment. However, as for transistors having characteristics that do not change even if they are located in different cells, such as the exemplary N-channel transistors shown in FIG. 5, the same model parameters can be used, and therefore, model parameters do not have to be extracted fro each transistor.

As described above, according to the present embodiment, even if the semiconductor circuit device is formed by mixedly providing a plurality of kinds of cells having mutually different distances Dsell, the trench isolation stress applied in the channel width direction of each transistor can be uniquely determined by only the channel width of the transistor itself irrespective of the shape of the other active area adjacent to the active area in which the transistor is located. Therefore, it becomes possible to suppress the variations in characteristics of the transistors having standardized channel widths in each cell which are caused by different trench isolation stresses, and thus it becomes possible to obtain the high-performance semiconductor circuit device.

Moreover, according to the present embodiment, even if the semiconductor circuit device is formed by mixedly providing a plurality of kinds of cells having mutually different distances Dsell, the trench isolation stress applied in the channel width direction of each transistor can be uniquely determined by only the channel width of the transistor itself irrespective of the shape of the other active area adjacent to the active area in which the transistor is located. Therefore, it becomes possible to extract model parameters as parameters dependent on the channel widths of the transistor model of each cell including the trench isolation stress applied in the channel width direction which is specific to each channel width.

Besides, the model parameters of the transistor model for a group of cells including a plurality of kinds of cells, which are extracted by the model parameter extraction method of the present embodiment, may be applied to each group of cells in carrying out circuit simulation for the semiconductor circuit device that is formed by combining a group of cells including a plurality of kinds of cells having mutually different distances D between the N-type and P-type substrate active areas. In that case, it becomes possible to suppress the variations in the characteristics of the transistors having identical channel widths in each cell which are caused by the trench isolation stress, and thus it becomes possible to carry out a high-precision circuit simulation for an overall LSI.

In the present embodiment, the dummy active area Rtd shown in FIG. 3 may be provided, and the PMIS active areas Rtp facing the associated N-channel transistors in the Y-direction do not have to be provided with gate electrodes 7 of P-channel MIS transistors. In other words, the P-channel transistors do not have to be provided in the present embodiment.

Furthermore, the length of each PMIS active area Rtp in the X-direction does not have to be equal to that of each NMIS active area Rtn in the X-direction, facing the PMIS active area Rtp in the Y-direction. Even in such a case, if a plurality of P-channel transistors are formed in a single PMIS active area Rtp as shown in FIG. 3, a plurality of NMIS active areas Rtn may each be located to face an associated one of the P-channel transistors in the Y-direction.

In the inventive semiconductor circuit device and the circuit simulation method for the circuit device, since trench isolation stresses applied in the channel width direction of each transistor become uniform, it is possible to provide a semiconductor circuit device in which variations in transistor characteristics due to different trench isolation stresses are slight.

What is claimed is:

1. A semiconductor circuit device comprising a cell in which MIS transistors are provided in a plurality of active areas surrounded by a trench isolation, wherein the cell comprises:

a plurality of PMIS active areas each provided with a gate of at least one P-channel transistor and arranged in a channel length direction; and a plurality of NMIS active areas each provided with a gate of at least one N-channel transistor and arranged in a channel length direction, wherein the plurality of PMIS active areas and the plurality of NMIS active areas are located to face each other in a channel width direction, wherein the semiconductor circuit device is designed such that the ends of at least one plurality of active areas, facing the other plurality of active areas, are aligned substantially on a single straight line, the one plurality of active areas and the other plurality of active areas being the plurality of PMIS active areas and the plurality of NMIS active areas, and wherein the semiconductor circuit device is designed such that a distance between each of the PMIS active areas and each of the NMIS areas in the channel width direction is 0.8 µm or less.

2. The semiconductor circuit device of claim 1, wherein as the one plurality of active areas, at least three or more active areas are provided.

3. The semiconductor circuit device of claim 1, wherein the semiconductor circuit device is designed such that the channel width of each transistor formed in the one plurality of active areas is 1.0 µm or less.

4. The semiconductor circuit device of claim 1, wherein at least one active area of the other plurality of active areas is a dummy active area in which a gate of a transistor is not provided.

5. The semiconductor circuit device of claim 1, wherein two or more active areas of the other plurality of active areas are facing one active area of the one plurality of active areas.

6. A circuit simulation method for a semiconductor circuit device comprising a cell in which MIS transistors are provided in a plurality of active areas surrounded by a trench isolation, the method comprising the steps of:
a) designing a layout including a plurality of first active areas for the MIS transistors, each provided with a gate of at least one transistor and arranged in a channel length direction, and a plurality of second active areas located to face the plurality of first active areas in a channel width direction of the gate and arranged in a channel length direction of the gate;
b) storing the layout, which has been designed in the step a), in a cell library; and
c) extracting, from the cell library, a model parameter of each transistor in accordance with a channel length and a channel width of each transistor in the first active area and a distance between the first and second active areas in the channel width direction, and simulating the circuit operation of the semiconductor circuit device,
wherein in the step a), the semiconductor circuit device is designed such that a distance between each of the PMIS active areas and each of the NMIS active areas in the channel width direction is 0.8 µm or less.

7. The circuit simulation method of claim 6, wherein in the step a), the layout is designed such that the ends of at least one plurality of active areas, facing the other plurality of active areas, are aligned substantially on a single straight line, the one plurality of active areas and the other plurality of active areas being the plurality of first active areas and the plurality of second active areas.

8. The circuit simulation method of claim 7, wherein as the one plurality of active areas, at least three or more active areas are laid out.

9. The circuit simulation method of claim 6, wherein in the step a), the layout is designed such that the channel width of each transistor formed in the first active area is 1.0 µm or less.

10. The circuit simulation method of claim 6, wherein in the step a), the layout is designed such that a gate of a MIS transistor of a conductivity type opposite to that of each transistor in the first active area is provided in at least one of the plurality of second active areas.

11. The circuit simulation method of claim 6, wherein in the step a), the layout is designed such that at least one of the plurality of second active areas is formed as a dummy active area in which a gate of a transistor is not provided.

12. The circuit simulation method of claim 6, wherein in the step a), the layout is designed such that two or more of the second active areas face one of the plurality of first active areas.

13. A semiconductor circuit device comprising a cell in which MIS transistors are provided in a plurality of active areas surround by a trench isolation,
wherein the cell comprises:
a plurality of PMIS active areas each provided with a gate of at least one P-channel and arranged in a channel length direction; and
a plurality of NMIS active areas each provided with a gate of at least one N-channel transistor and arranged in a channel length direction,
wherein the plurality of PMIS active areas and the plurality of NMIS active areas are located to face each other in a channel width direction,
wherein the semiconductor circuit device is designed such that the ends of at least one plurality of active areas, facing the other plurality of active areas, are aligned substantially on a single straight line, the one plurality of active areas and the other plurality of active areas being the plurality of PMIS active areas and the plurality of NMIS active areas, and
wherein at least one active area of the other plurality of active areas is a dummy active area in which a gate of a transistor is not provided.

14. A circuit simulation method for a semiconductor circuit device comprising a cell in which MIS transistors are provided in a plurality of active areas surrounded by a trench isolation, the method comprising the steps of:
a) designing a layout including a plurality of first active areas for the MIS transistors, each provided with a gate of at least one transistor and arranged in a channel length direction, and a plurality of second active areas located to face the plurality of first active areas in a channel width direction of the gate and arranged in a channel length direction of the gate;
b) storing the layout, which has been designed in the step a), in a cell library; and
c) extracting, from the cell library, a model parameter of each transistor in accordance with a channel length and a channel width of each transistor in the first active area and a distance between the first and second active areas in the channel width direction, and simulating the circuit operation of the semiconductor circuit device,
wherein in the step a), the layout is designed such that at least one of the plurality of second active areas is formed as a dummy active area in which a gate of the transistor is not provided.

* * * * *